United States Patent [19]

Miyashita et al.

[11] Patent Number: 5,267,270
[45] Date of Patent: Nov. 30, 1993

[54] DIGITAL TRANSMISSION CIRCUIT

[75] Inventors: Miyo Miyashita; Noriyuki Tanino, both of Itami, Japan

[73] Assignee: Mitsubishi Denki Kabushiki Kaisha, Tokyo, Japan

[21] Appl. No.: 682,969

[22] Filed: Apr. 10, 1991

[30] Foreign Application Priority Data

Sep. 7, 1990 [JP] Japan .................................. 2-237594

[51] Int. Cl.[5] .......................................... H04L 25/06
[52] U.S. Cl. ..................................... 375/76; 307/270; 307/448
[58] Field of Search .................... 375/36, 75, 76, 17; 307/270, 359, 446, 448

[56] References Cited

U.S. PATENT DOCUMENTS

| | | | |
|---|---|---|---|
| 3,509,279 | 4/1970 | Martin et al. | 375/76 |
| 4,307,465 | 12/1981 | Geller | 375/76 |
| 4,445,222 | 4/1984 | Smitt | 375/36 |
| 4,459,699 | 7/1984 | Monticelli et al. | 375/76 |
| 4,785,467 | 11/1988 | Yamada | 375/17 |

FOREIGN PATENT DOCUMENTS

| | | |
|---|---|---|
| 3137906 | 6/1982 | Fed. Rep. of Germany . |
| 3618882 | 12/1986 | Fed. Rep. of Germany . |
| 0212780 | 12/1984 | Japan .................................. 375/76 |
| 61-281711 | 12/1986 | Japan . |
| 922265 | 12/1961 | United Kingdom . |
| 1483796 | 8/1974 | United Kingdom . |

OTHER PUBLICATIONS

Kachwalla, "Characterizing Traps in MESFETs using Internal Transconductance ($g_m$) Frequency Dispersion", Solid State Electronics, vol. 31, No. 8, 1988, pp. 1314-1320.

Larson, "An Improved GaAs MESFET Equivalent Circuit Model for Analog Integrated Circuit Applications", Journal of Solid-State Circuits, vol. SC-22, No. 4, 1987, pp. 567-574.

Osafune et al, "Ultra-High-Frequency GaAs MMIC Multiplier", Japanese Society of Electronics, vol. J73-C-11, No. 2, pp. 132-134.

*Primary Examiner*—Curtis Kuntz
*Assistant Examiner*—Young Tse
*Attorney, Agent, or Firm*—Leydig, Voit & Mayer

[57] ABSTRACT

A digital transmission circuit for processing and outputting a digital output signal includes a mark density detecting circuit for detecting the amplitude of the DC signal component of the digital signal and a DC level shifter superposing a DC signal component on the digital signal in response to the detected amplitude. Thereby, the output signal level, regardless of the mark density of the input signal, does not drift.

10 Claims, 24 Drawing Sheets

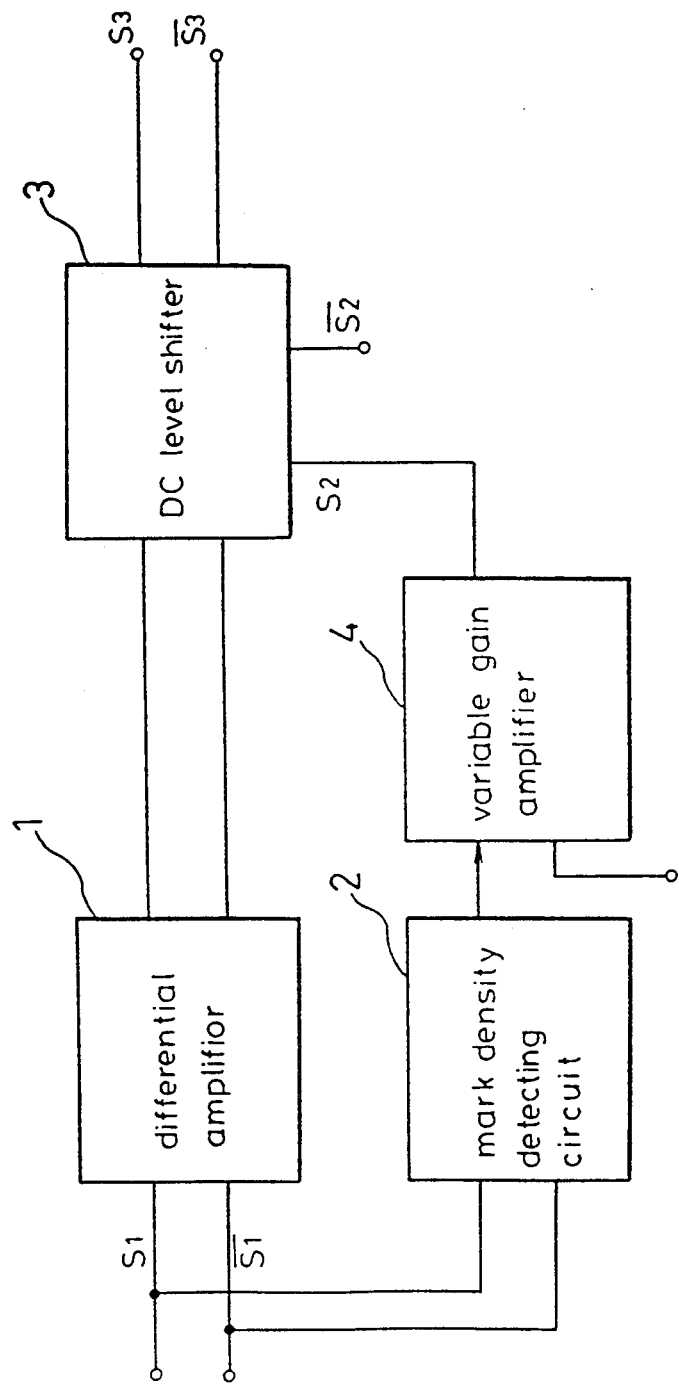

$$f_{IN}(t) = \begin{cases} H & 0 < t < \tfrac{1}{2}T \\ L & \tfrac{1}{2}T < t < T \end{cases}$$

$$f_{IN}(t) = \begin{cases} H & 0 < t < \tfrac{1}{8}T \\ L & \tfrac{1}{8}T < t < T \end{cases}$$

F I G. 16
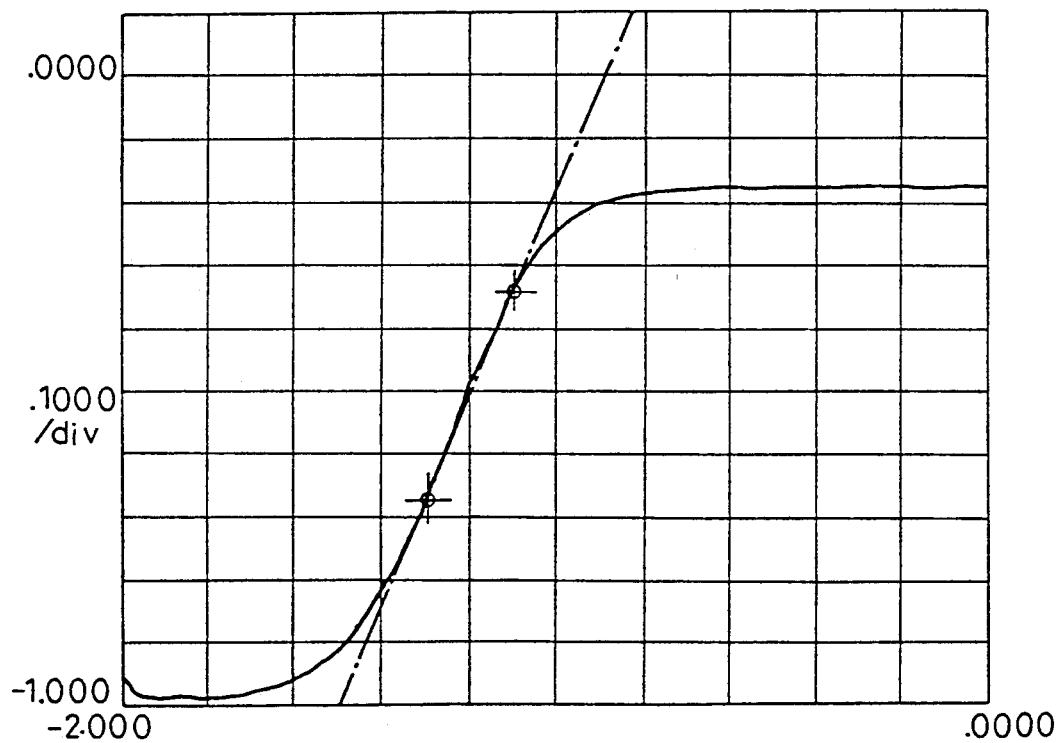

| MARK DENSITY | 0 | 1/8 | 1/4 | 1/2 | 3/4 | 7/8 | 1 |
|---|---|---|---|---|---|---|---|
| DETECTING VOLTAGE | -0.103 | -0.170 | -0.225 | -0.331 | -0.432 | -0.481 | -0.527 |

FIG. 20
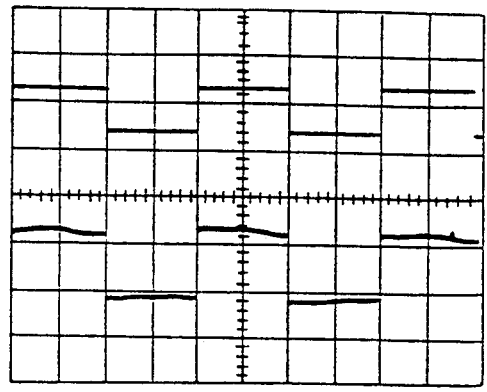
(mark density 1/2)  0.1μS/DIV
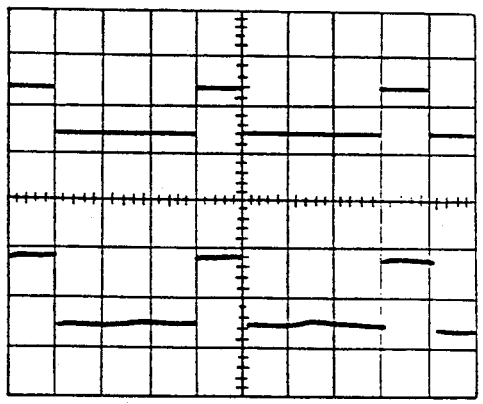
(mark density 1/4)
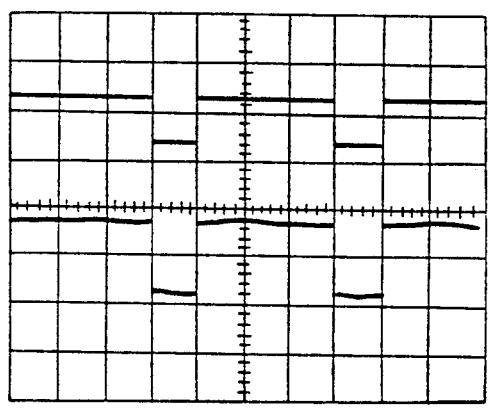
(mark density 3/4)
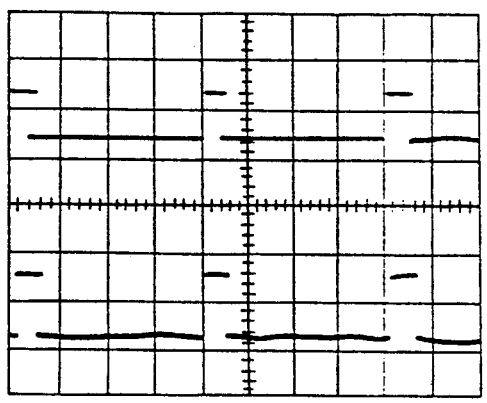
(mark density 1/8)
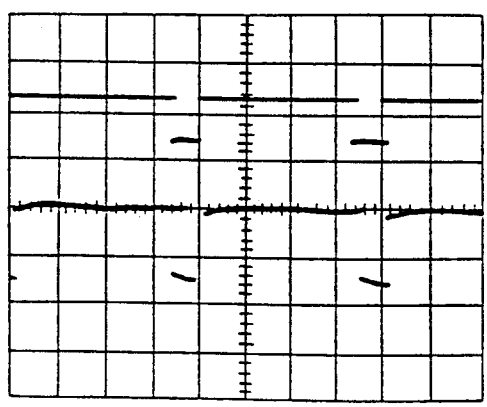
(mark density 7/8)

FIG. 21
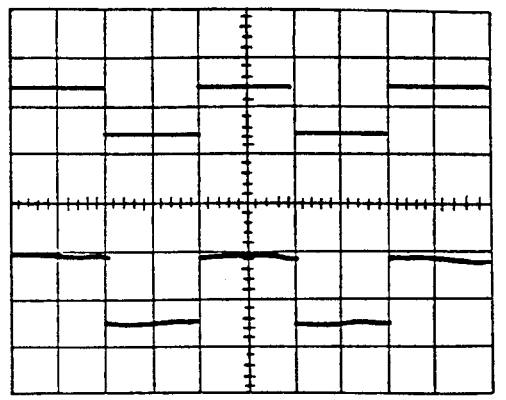
(mark density 1/2)   0.1µS/DIV
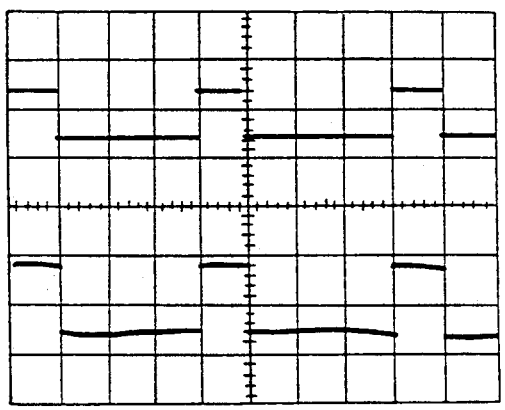
(mark density 1/4)
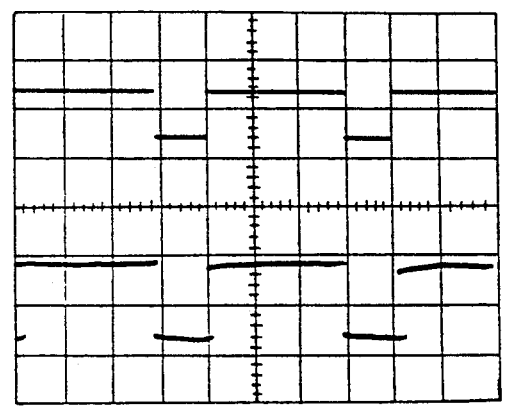
(mark density 3/4)
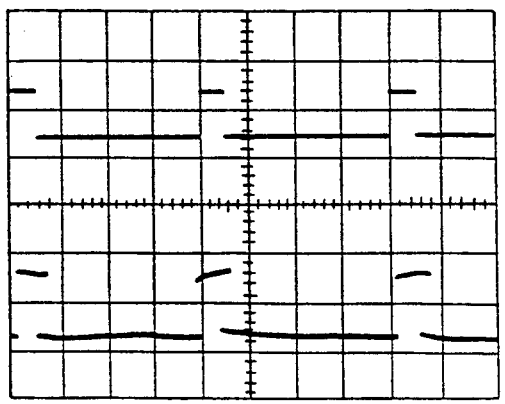
(mark density 1/8)
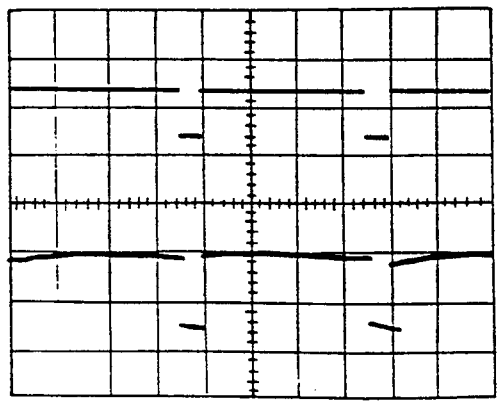
(mark density 7/8)

DIGITAL TRANSMISSION CIRCUIT

FIELD OF THE INVENTION

The present invention relates to a digital transmission circuit, and more particularly to a circuit which compensates for drift of the output level (H level and L level).

BACKGROUND OF THE INVENTION

FIGS. 9 and 10 show a block diagram and a circuit construction diagram of a conventional digital transmission circuit using source coupled field effect transistors. In these figures, reference numeral 1 designates a differential amplifier comprising field effect transistors (hereinafter referred to as FET) $Q_1$ and $Q_2$, constituting source coupled switches, loads $Z_1$ and $Z_2$ of the FETs $Q_1$ and $Q_2$, and an FET $Q_3$ as a constant current load which connects the source terminal to the power supply terminal. Reference character $V_{ss}$ designates a power supply terminal of the digital transmission circuit. The other power supply terminal of the circuit is grounded.

A description is given of the operation.

Generally, suppose that the drain current of the FET is $I_{DS}$, drain voltage $V_D$, gate voltage $V_G$, source voltage $V_S$, and the threshold voltage of the gate $V_{TH}$, the static characteristics of the FET are: saturation region:
$I_{DS}=K(V_G-V_s-V_{TH})^2$
: $0<V_G-V_S-V_{TH}\leq V_D-V_S$
non-saturation region:
$I_{DS}=K\{2(V_G-V_S-V_{TH})\cdot(V_D-V_S)-(V_D-V_S)^2\}$
: $V_D-V_S<V_G-V_S-V_{TH}$
switch off region: $I_{DS}=0$
: $V_G-V_S-V_{TH}\leq 0$
Here, reference character K is transconductance In FIG. 10, it is assumed that all FETs are operated in the saturation region.

First of all, the DC characteristics of the digital transmission circuit will be described In FIG. 10, suppose that DC voltages $V_{IN}$ and $\overline{V}_{IN}$ are input to the gate terminals IN and $\overline{IN}$ of the source coupled FETs $Q_1$ and $Q_2$, respectively. Then, supposed that the drain current of the FETs $Q_1$ and $Q_2$ are $I_1$ and $I_2$ and the current flowing through the constant current load FET $Q_3$ is $I_0$.

In the above-described digital transmission circuit, when the characteristics of the FETs $Q_1$, $Q_2$ and the loads $Z_1$, $Z_2$ are equal to each other, respectively, the output voltages $\overline{V_{OUT}}$ and $V_{OUT}$ taken out from the drain terminals $\overline{OUT}$ and OUT of the respective FETs $Q_1$ and $Q_2$ are, supposing that the loads of the FETs $Q_1$ and $Q_2$ are $Z_1=Z_2=Z$:

$I_0=I_1+I_2$ $V_{\overline{OUT}}=-Z\cdot I_1$ $V_{OUT}=-Z\cdot I_2$

Therefore, the voltage characteristics are as shown in FIG. 11. That is, when a constant voltage is applied to the terminal $\overline{IN}$, the voltage gain $[V_{OUT}/(V_{IN}-\overline{V}_{IN})]$ has an inclination of $G_0$ and the output voltage is represented by $V_{OUT}=G_0\cdot(V_{IN}-\overline{V}_{IN})-Z\cdot I_0/2$ (1)

Next, a description is given of the pulse response of the above-described digital transmission circuit.

Suppose that a constant voltage $V_R$ is input to the terminal $\overline{IN}$ and a pulse signal $F_{IN}(t)$ having a mark density of ½ as shown in FIG. 12(a) is input to the terminal IN. Further, suppose that the input/output of the signal is performed in the linear region (a region where the input signal is linearly amplified) of the I/0 characteristics of FIG. 11. Then, when the output signal at the output OUT is made $F_{OUT}(t)$ and there is no frequency dependency in the voltage gain of the circuit, this $F_{OUT}(t)$ is represented by the following formula from the above-described formula (1), $F_{OUT}(t)=G_0\cdot(F_{IN}(t)-V_R)-Z\cdot I_0/2$.

When a GaAs MESFET is used, however, the transconductance gm or drain conductance Gd, which are device parameters of an FET, are frequency dependent at low frequency (below 100 kHz) and influence the circuit characteristics. The gain of the circuit has a frequency dependency and is gradually reduced from DC toward higher frequencies as shown in FIG. 13. In digital transmission, the input signal is a pulse signal whose mark density always changes and the pulse waveform includes a DC component dependent on the mark density and a high frequency component. Since the gain varies for the respective components because of the above-described frequency dependency, the DC level varies significantly with the amplitude of the high frequency component and there is a change in the output level (H level and L level) therewith.

With respect to the above-described phenomenon, the outputs when pulses having different mark densities are input are compared.

A case where a signal $F_{IN(\frac{1}{2})}(t)$ which has a mark density of ½ as shown in FIG. 12(a) is input and a case where a signal $F_{IN(\frac{1}{8})}(t)$ which has mark density of ⅛ as shown in FIG. 12(b) is input are considered.

When the pulse of FIGS. 12(a) and 12(b) are divided into the DC component and high frequency component, the followings are obtained.

$F_{IN(\frac{1}{2})}(t)=a_0+a_1$ (2)

$F_{IN(\frac{1}{8})}(t)=c_0+c_1$ (3)

Here, $a_0 = (L + (H - L)/2)$ $a_1 = (2(H - L)/\pi) \sum_{n=1}^{\infty} (1/(2n - 1)) \cdot \sin(2(2n - 1)\pi t/T))$ $c_0 = (L + (H - L)/8)$ $c_1 = (2(H - L)/\pi) \sum_{n=1}^{\infty} ((1/n) \cdot \cos(2n\pi t/T - n\pi/8) \cdot \sin(n t/8))$ Now, when the DC voltage gain is $G_0$, the voltage gain above 100 kHz is $G_1$, and $1/T \gg 100$ kHz, the output signal $F_{OUT}$ is represented as in the following for signals of respective mark densities;

$F_{OUT(\frac{1}{2})}(t)=-G_0\cdot V_R-Z\cdot I_0/2+(G_0-G_1)\cdot a_o+G_1\cdot F_{IN(\frac{1}{2})}(t)$ (4)

$F_{OUT(\frac{1}{8})}(t)=-G_0\cdot V_R-Z\cdot I_0/2+(G_0-G_1)\cdot c_0+G_1\cdot F_{IN(\frac{1}{8})}(t)$ (5)

the output waveforms are shown in FIG. 14(a) and 14(b).

The signal level difference represented by the formulae (4) and (5) (formula(4)-formula(5)) becomes $$F_{OUT(\frac{1}{4})}(t) - F_{OUT(\frac{1}{2})}(t) = (G_0 - G_1)(a_0 - c_0) + G_1 \cdot \{F_{in(\frac{1}{4})}(t) - F_{in(\frac{1}{2})}(t)\} \quad \ldots (6)$$

In the above-described formula (6), the second term does not vary the output level (H level and L level). Therefore, in the signals having mark densities of $\frac{1}{4}$ and $\frac{1}{2}$, the variation of output level (H level and L level) arises from $\Delta DC_{(\frac{1}{4}-\frac{1}{2})} = (G_0 - G_1)(a_0 - c_0)$, that is, by the amount of (voltage gain at DC−voltage gain at high frequency)·(DC level difference of the input signal).

The conventional digital transmission circuit is constructed as described above and there is a frequency dependency as shown in FIG. 13 in the circuit gain because of variation of the device parameter of GaAs MESFETs with frequency, and therefore the output level varies with the duty cycle of input signal.

SUMMARY OF THE INVENTION

The present invention is directed to solving the above described problems and has for its object to provide a digital transmission circuit that can suppress variation of the output level regardless of the mark density of the input signal.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In accordance with a digital transmission circuit of the present invention, a digital transmission circuit is inserted between the input and the output of the digital circuit and has a DC level shifter which multiplies a DC signal component of the digital signal and a mark density detecting circuit for detecting the DC signal component of the digital signal and controlling the DC level shifter.

In accordance with the present invention, a DC signal component depending on the mark density is detected and the DC level shifter is controlled to output a DC signal component in accordance with the detected signal thereby to compensate for the drift of the output signal level. Therefore, even if the mark density of the input signal is changed, the output signal level can be kept constant

BRIEF DESCRIPTION OF THE DRAWINGS

FIG. 7 is a block diagram in which a variable gain amplifier is provided with the circuit of FIG. 1;

FIG. 16 is a diagram showing the DC input characteristics of a differential amplifier;

FIGS. 20 and 21 are oscilloscope traces showing the transmission characteristics of the differential amplifier when the output level of 5 Mb/s is not corrected and is corrected, respectively;

DETAILED DESCRIPTION OF THE PREFERRED EMBODIMENT

An embodiment of the present invention will be described in detail with reference to the drawings.

Figure 1:
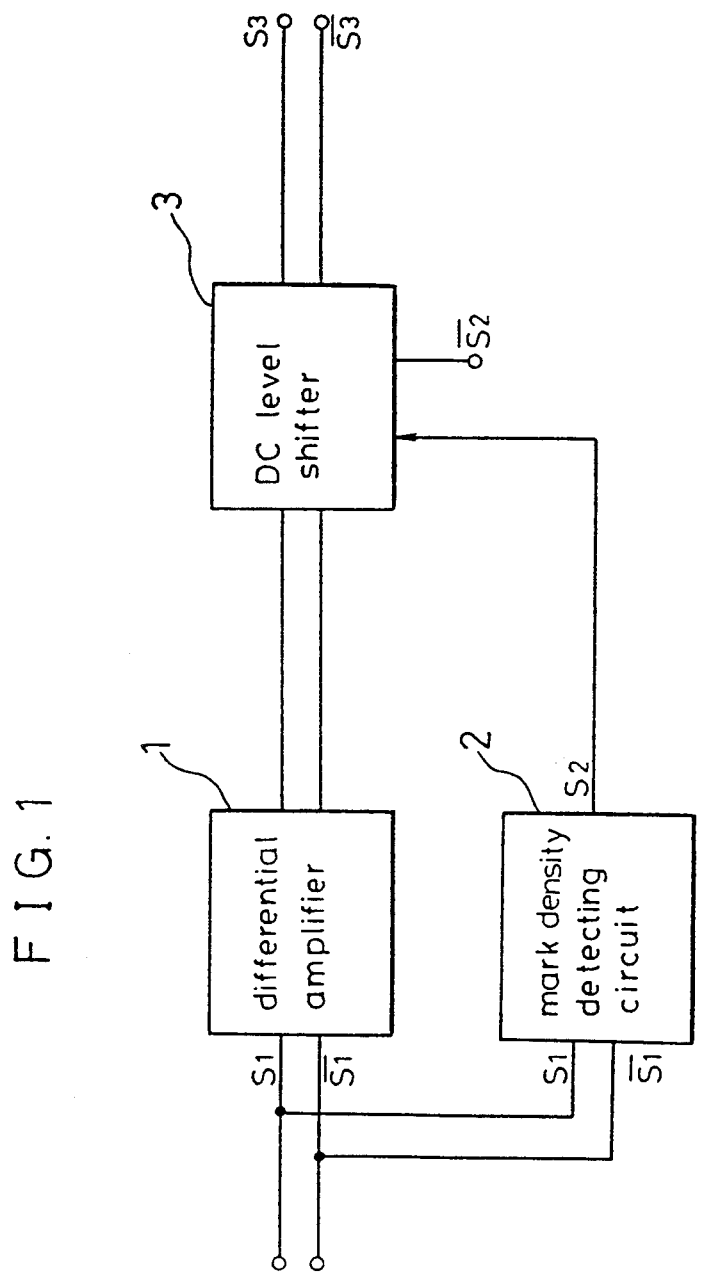
FIGS. 1 and 2 are respectively a block diagram and a circuit construction diagram of a digital transmission circuit in accordance with a first embodiment of the present invention.
Figure 2:
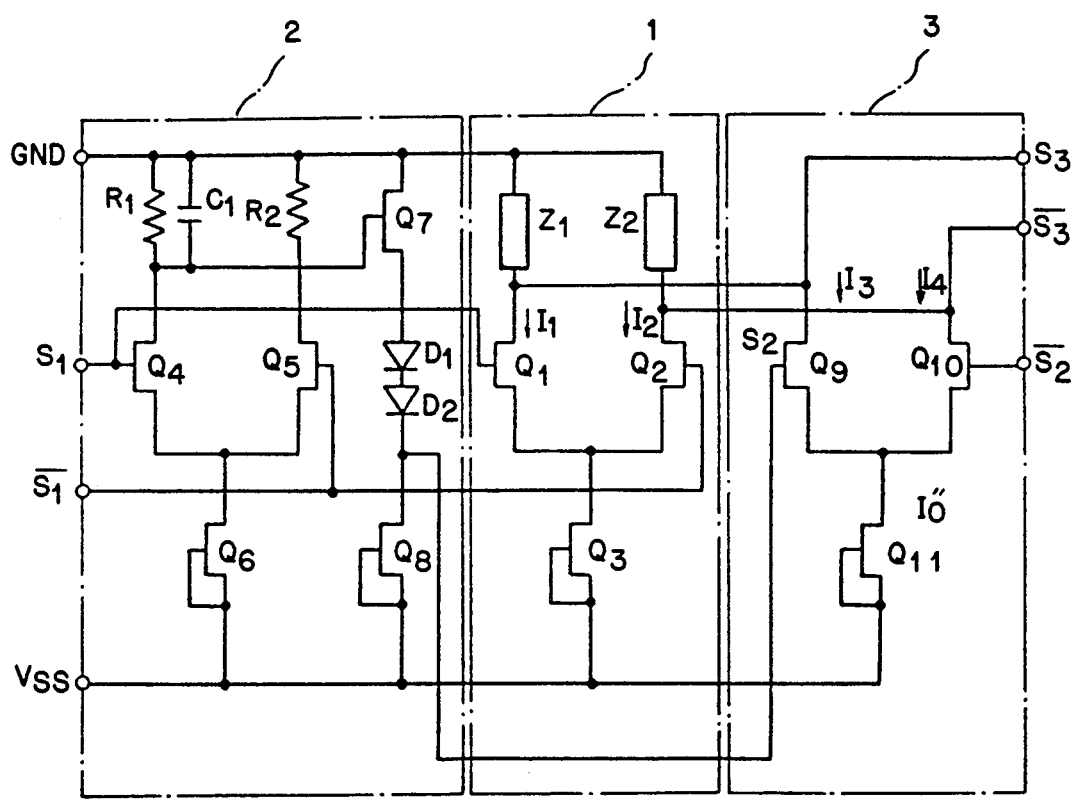
Figure 9:
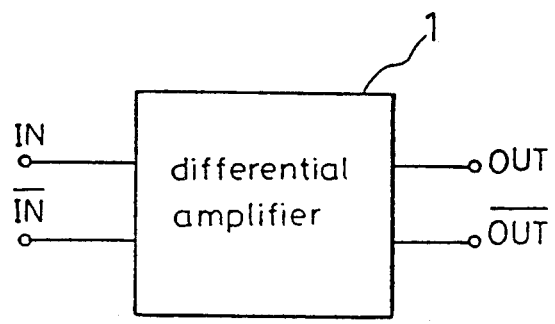
FIGS. 9 and 10 are circuit construction diagrams of a conventional digital transmission circuit utilizing source coupled field effect transistors.

FIGS. 1 and 2 show a block diagram and a circuit construction diagram of a digital transmission circuit in accordance with a first embodiment of the present invention. In these figures, the same reference numerals as those shown in FIGS. 9 and 10 designate the same portions. Reference numeral 1 designates a differential amplifier Reference numeral 2 designates a mark density detecting circuit and reference numeral 3 designates a DC level shifter In this embodiment, the mark density is detected at the input side of the differential amplifier 1 and the digital input signal is amplified and corrected at the output end of the amplifier 1.

Figure 10:
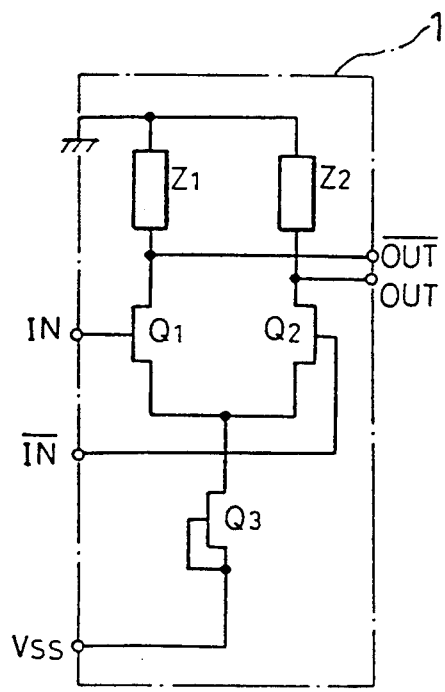

The differential amplifier 1 has the same construction as that of the differential amplifier 1 in FIG. 10.

In the mark density detecting circuit 2, reference numerals $Q_4$ and $Q_5$ designate FETs constituting source coupled switches. Resistors $R_1$ and $R_2$ are connected to the FETs $Q_4$ and $Q_5$ as loads of the FETs $Q_4$ and $Q_5$. A capacitor of capacitance $C_1$ is connected in parallel with the resistor $R_1$ for grounding the drain of the FET $Q_4$ with respect to AC current. An FET $Q_6$ is provided so as to connect the sources of the FETs $Q_4$ and $Q_5$ to the source power supply terminal of the FETs $Q_4$ and $Q_5$ which functions as a constant current load. An FET $Q_7$ constitutes a source follower and the gate thereof is connected to the other end of the resistor $R_1$ and the capacitor $C_1$. Level shift diodes $D_1$ and $D_2$ are connected to the source terminal of the FET $Q_7$. An FET $Q_8$, whose source supply power terminal is connected to the cathode terminal of the diode $D_2$, functions as a constant current load.

The DC level shifter 3 comprises FETs $Q_9$ and $Q_{10}$ constituting a first source coupled switch and an FET $Q_{11}$ which connects the source terminals of the FETs $Q_9$ and $Q_{10}$ to the source power supply terminal, which functions as a constant current load.

A description is given of the operation.

When the DC component of the input pulse $F_{IN(M)}(t)$ of the mark density M is made $M_0$ and the high frequency component made $M_1$, the input pulse $F_{IN(M)}(t)$ is represented as follows, $$F_{IN(M)}(t) = M_0 + M_1 \quad (7)$$

Suppose that this signal is input to the input $S_1$ of the digital transmission circuit of FIG. 2 and further, that a reference voltage $V_R$ is given to the input $S_1$.

Then, the output signal from the FET $Q_2$ constituting a source coupled switch of the differential amplifier 1 is represented by $$I_{2(M)}(t) \cdot Z = -G_{S0}V_R - Z \cdot I_0/2 + (G_{S0} - G_{S1})M_0 + G_{S1} \cdot F_{IN(M)}(t) \quad (8)$$

Here, $G_{S0}$ and $G_{S1}$ are the DC gain and the high frequency gain of the differential amplifier, $I_{2(M)}(t)$ is the current flowing through the FET $Q_2$ at time t, and $I_0$ is a constant current flowing through the FET $Q_3$.

On the other hand, a DC voltage proportional to the DC level of the input signal $F_{IN(M)}(t)$ can be taken out from the filter circuit constituted by the resistor $R_1$ and the capacitor $C_1$ in the mark density detecting circuit 2, and the DC voltage $S_{2(M)}$ which can be taken out in response to the input signal represented by the formula (7) is $$S_{2(M)} = -G_{M0}(M_0 - V_R) - V_S \quad (9)$$

Here, $-G_{M0}$ is the DC gain of the mark density detecting circuit 2 and the negative sign shows that the phase of the output signal is inverted in relative to the input and $V_S$ is the shift amount of the source follower circuit constituted by the FETs $Q_7$ and $Q_8$ and the diodes $D_1$ and $D_2$. The signal represented by the formula (9) is input to the DC level shifter 3.

When a reference voltage $V_B$ is applied to the other input $\overline{S}_2$ of the DC level shifter 3, the output signal of the FET $Q_{10}$ constituting a source coupled switch of the DC level shifter 3 is represented as follows $$I_{4(M)} \cdot Z = -G_{L2} \cdot (G_{M0}(M_0 - V_R) + V_S + V_B) - Z \cdot I_0''/2 \quad (10)$$

Figure 3:
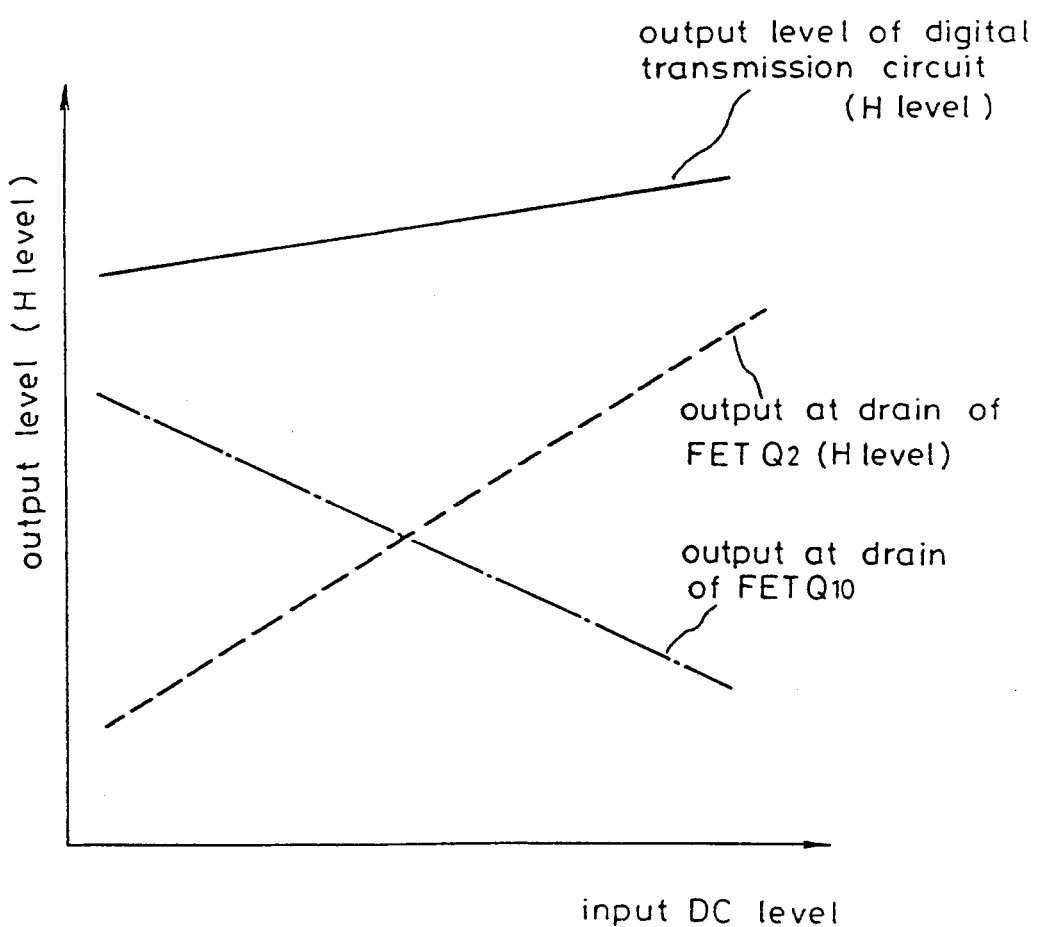
FIG. 3 is a diagram showing a manner of correction in the digital transmission circuit in accordance with the first embodiment of the present invention.

Here, $I_{4(M)}$ is the current flowing through the FET $Q_{10}$, $I_0''$ is a constant current flowing through the FET $Q_{11}$, and $G_{L2}$ is a DC voltage gain of the DC level shifter 3. From the above described formulae (8) and (10), the output level of the source coupled switch FET $Q_2$ of the differential amplifier 1 varies in proportion to the DC level of the input and the output level of the source coupled switch FET $Q_{10}$ of the DC level shifter 3 is inversely proportional to the DC level of the input. By multiplying the output level of the source coupled switch of the DC level shifter 3 and the output level of the source coupled switch of the differential amplifier 1, the variation of the output level of the digital transmission circuit can be controlled. The manner of correction is shown in FIG. 3.

From the formulae (8) and (10), the output signal $F_{OUT(M)}(t)$ at the output $S_3$ of the digital transmission circuit is represented by $$\begin{aligned}F_{OUT(M)}(t) &= I_{1(M)}(t) \cdot Z + I_{4(M)}(t) \cdot Z \quad (11)\\ &= -Z \cdot (I_0' + I_0'')/2 - G_{S0} \cdot V_R - G_{L2} \cdot (V_B - G_{M0} \cdot V_R + V_S) + M_0 \cdot ((G_{S0} - G_{S1}) - G_{L2} \cdot G_{M0}) G_{S1} \cdot F_{IN(M)}(t)\end{aligned}$$

From the formula (11), the condition where the output level has no variation depending on the mark density (DC level of the input) is represented by $$G_{M0} = (G_{S0} - G_{S1})/G_{L2} \quad (12)$$

Therefore, the voltage gains of the respective circuits may be adjusted so that the above-described formula (12) is satisfied. For example, by changing the gain of the mark density detecting circuit 2 thereby to satisfy the formula (12), the voltage gain of the mark density detecting circuit 2 is represented by $$G_{M0} = gm \cdot R$$

Here, R designates the resistance value of the resistor $R_1$. Therefore, by adjusting the value of $R_1$ using a variable resistor for the resistor $R_1$, the condition of the formula (12) is satisfied and the output level of the digital transmission circuit is corrected.

Figure 4:
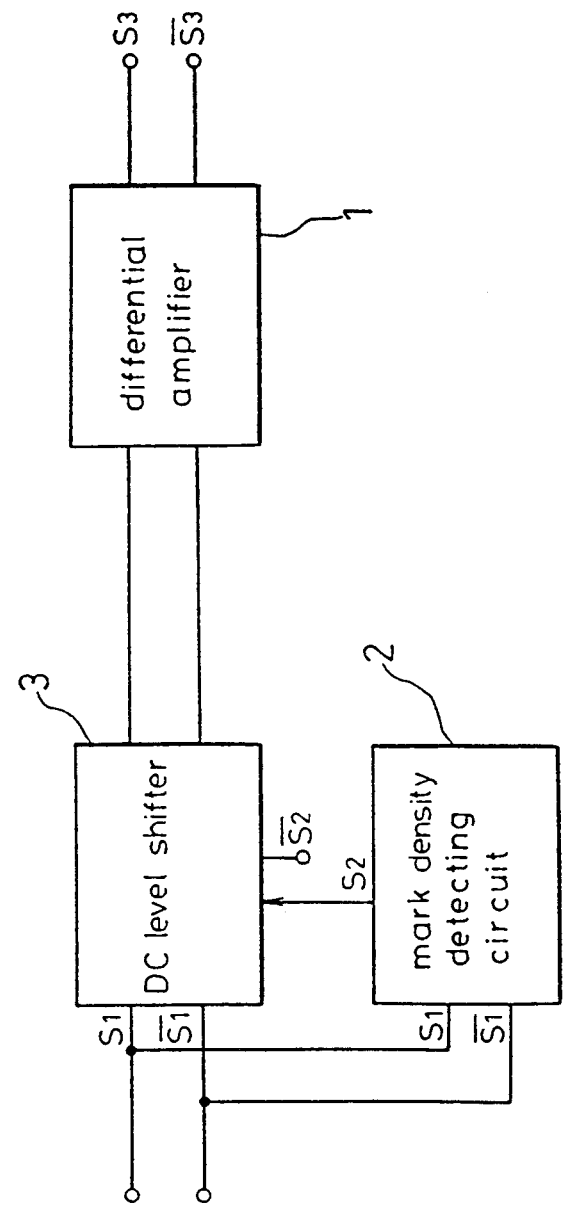
FIGS. 4 and 5 are respectively a block diagram and a circuit construction diagram showing a digital transmission circuit of another embodiment of the present invention.
Figure 5:
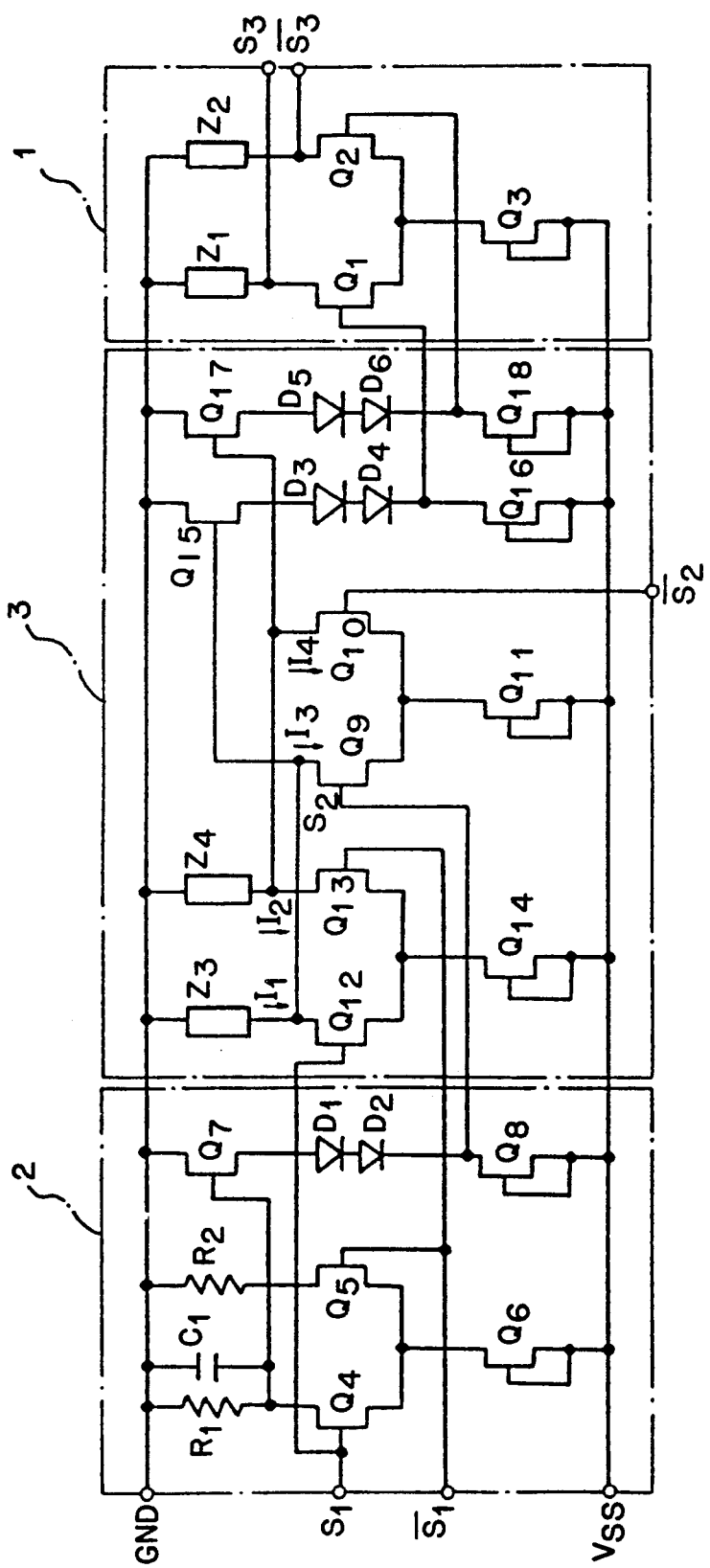

The block construction and a circuit construction of a digital transmission circuit in accordance with another embodiment of the present invention will be described with reference to FIGS. 4 and 5. In these figures, the same reference numerals as those shown in FIGS. 1 and 2 designate the same portions. In this embodiment a mark density detecting circuit 2 and a DC level shifter 3 are provided before the differential amplifier 1. The detection of mark density is performed by the input of the differential amplifier 1 as in the above embodiment but the correction is also performed before the digital signal is amplified. The detailed construction will be described with reference to FIG. 5. In the DC level shifter 3, FETs $Q_{12}$ and $Q_{13}$ constitute a second source coupled switch. An FET $Q_{14}$ is an FET which connects the source terminals of the FETs $Q_{12}$ and $Q_{13}$ to the source power supply terminal and functions as a constant current load. Loads $Z_3$ and $Z_4$ of the FETs $Q_{12}$ and $Q_{13}$ are respectively connected between the FETs $Q_{12}$ and $Q_{13}$ and the power supply voltage. FETs $Q_{15}$ and $Q_{17}$ constituting source followers are provided. Series connected level shift diode pairs $D_3$ and $D_4$ and $D_5$ and $D_6$ are respectively connected to the source terminals of the FETs $Q_{15}$ and $Q_{17}$. FETs $Q_{16}$ and $Q_{18}$ respectively connect the cathode terminals of the diodes $D_4$ and $D_6$ to the source power supply terminal and function as a constant current loads. The circuit constructions of the differential amplifier 1 and the mark density detecting circuit 2 are the same as the above-described embodiments.

A description is given of the operation.

The output signal of the FET $Q_{13}$ constituting the second source coupled switch of the DC level shifter 3 is represented by $$I_{2(M)}(t) \cdot Z = -G_{L0} \cdot V_R - Z \cdot I_0''/2 + (G_{L0} - G_{L1})M_0 + G_{L1} \cdot F_{IN(M)}(t) \qquad (13)$$

On the other hand, the output DC voltage $S_{2(M)}$ of the mark density detecting circuit 2 is given by the formula (9) similarly as in the above-described embodiment. Accordingly, the output signal by the FET $Q_{10}$ constituting a first source coupled switch of the DC level shifter 3 can be represented by the above-described formula (10) similarly as in the above-described embodiment.

From the formulae (10) and (13), the signal $F_{IN'(M)}(t)$ at the input of the differential amplifier 1 (gate terminal of the FET $Q_1$) is represented by $$\begin{aligned} F_{IN'(M)}(t) &= I_{1(M)}(t) \cdot Z + I_{3(M)}(t) \cdot Z \qquad (14) \\ &= -Z \cdot (I_0' + I_0'')/2 - G_{L0} \cdot V_R - G_{L2} \cdot (V_B - G_{M0} \cdot V_R + V_S) + M_0 \cdot ((G_{L0} - G_{L1}) - G_{L2} \cdot G_{M0}) \, G_{L1} \cdot F_{IN(M)}(t) \end{aligned}$$

From the formula (14), the condition where the output level of the differential amplifier 1 has no variation depending on the mark density (DC level of the input) is represented by $$G_{M0} = (G_{S0} \cdot G_{L0} - G_{S1} \cdot G_{L1}) / G_{S0} \cdot G_{L2} \qquad (15)$$

Therefore, by adjusting the voltage gains of the respective circuits to satisfy the above-described formula (15), the same effects as those in the above embodiment can be obtained.

Figure 6A:
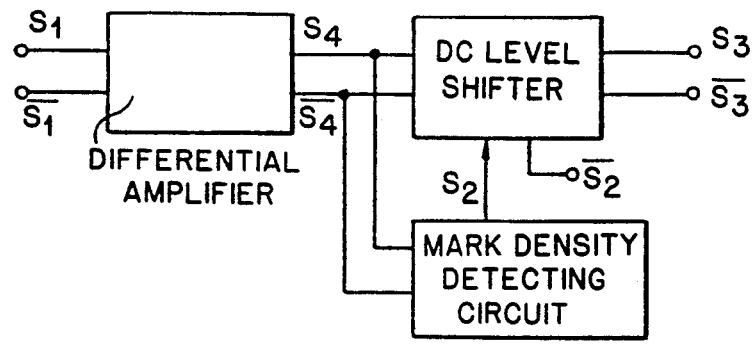
FIGS. 6(a)–6(d) are block diagrams showing an alternatives of the first embodiment of the present invention.
Figure 6B:
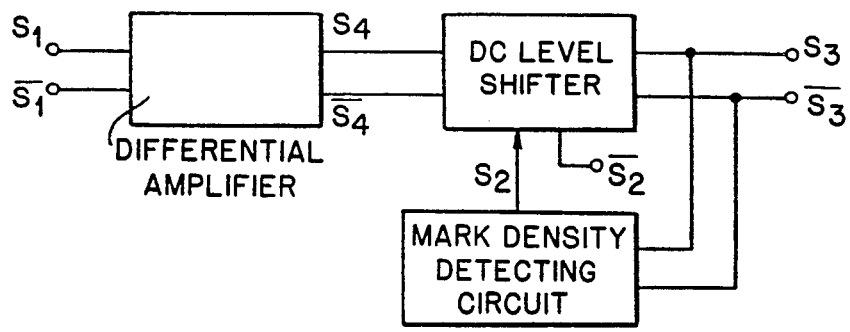
Figure 6C:
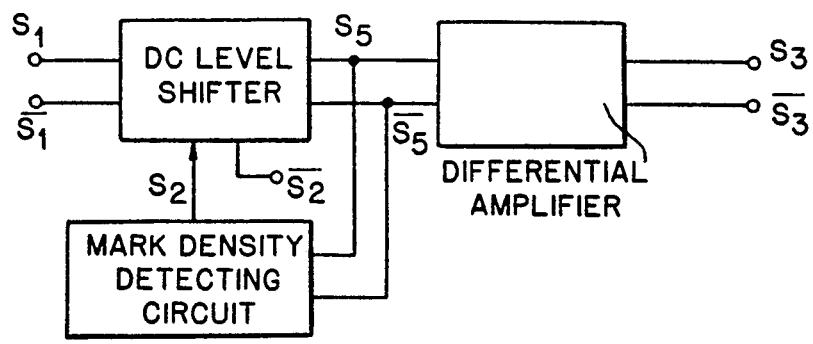
Figure 6D:
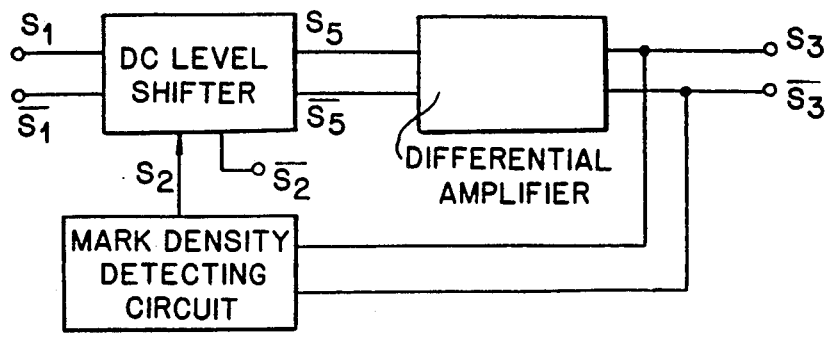

FIGS. 6(a) and 6(b) are alternatives of the first embodiment in which only the position for detecting the mark density is different. FIGS. 6(c) and 6(d) show alternatives of the second embodiment in which only the position fo detecting the mark density is different and the same effects as the above-described embodiment are obtained.

The method of adjusting the voltage gain in the above-described embodiments will be described with reference to the first embodiment.

Figure 8:
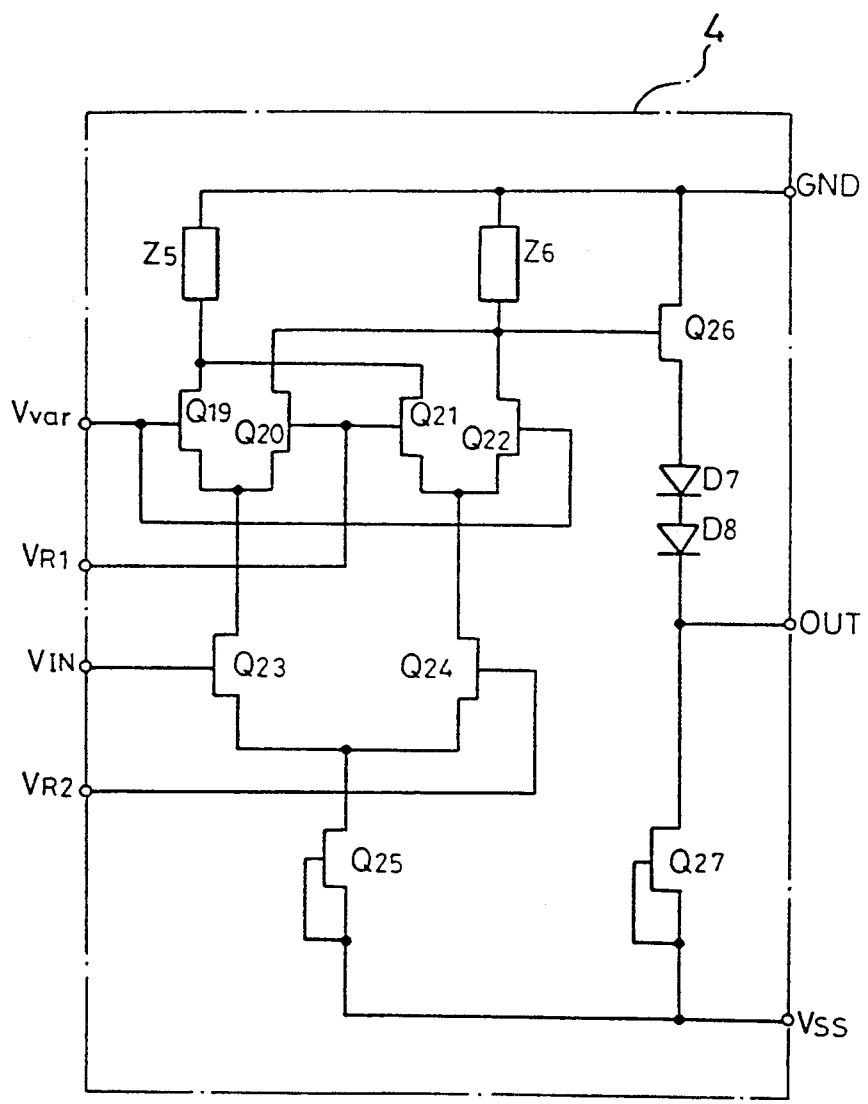
FIG. 8 is a circuit construction diagram of a variable gain amplifier of FIG. 7.

FIG. 7 shows a circuit in which a variable gain amplifier 4 is provided between the mark density detecting circuit 2 and the DC level shifter 3 of the circuit shown in FIG. 1. The construction of the variable gain amplifier 4 is shown in FIG. 8. FETs $Q_{19}$ and $Q_{20}$ constituting a first source coupled switch are provided. FETs $Q_{21}$ and $Q_{22}$ constitute a second source coupled switch. Loads $Z_5$ and $Z_6$ are respectively connected the drain terminals of the FET $Q_{19}$ and $Q_{21}$ and $Q_{20}$ and $Q_{22}$, respectively. FETs $Q_{23}$ and $Q_{24}$, whose drain terminals are respectively connected the source terminals of the FET $Q_{19}$ and $Q_{20}$ and $Q_{21}$ and $Q_{22}$, constitute a third source coupled switch. An FET $Q_{25}$ which connects the source terminals of the FETs $Q_{23}$ and $Q_{24}$ to the source power supply terminal functions as a constant current load. An FET $Q_{26}$ constituting a source follower is provided. Level shift diodes $D_7$ and $D_8$ are connected to the source terminal of the FET $Q_{26}$. An FET $Q_{27}$ which connects the cathode terminal of the diode $D_8$ to the source power supply terminal functions as a constant current load.

A description is given of the operation.

The total voltage gains of the DC level adjusting system comprising the mark density detecting circuit 2, the variable gain amplifier 4, and the DC level shifter 3 are represented by $G_{M0}$, $G_{L2}$, and $G_{var}$, respectively, and the condition where the output level has no variation is as follows from the formula (12), $$G_{var} = (G_{S0} - G_{S1})/(G_{M0} \cdot G_{L2}) \qquad (16)$$

On the other hand, the variable gain amplifier of FIG. 8 is a generally GaAs MESFET Gilbert cell and the voltage gain is represented by $$G_{var} = \beta(V_{var} - V_{R1})$$

Here, $V_{var}$ is the gate voltage of the FETs $Q_{19}$ and $Q_{22}$ and $V_{R1}$ is the gate voltage of the FETs $Q_{20}$ and $Q_{21}$. Further, $\beta$ is a proportionality constant. Therefore, by adjusting the voltage $V_{var}$, the condition of the formula (16) is satisfied and the output level of the digital transmission circuit is corrected.

Figure 17:
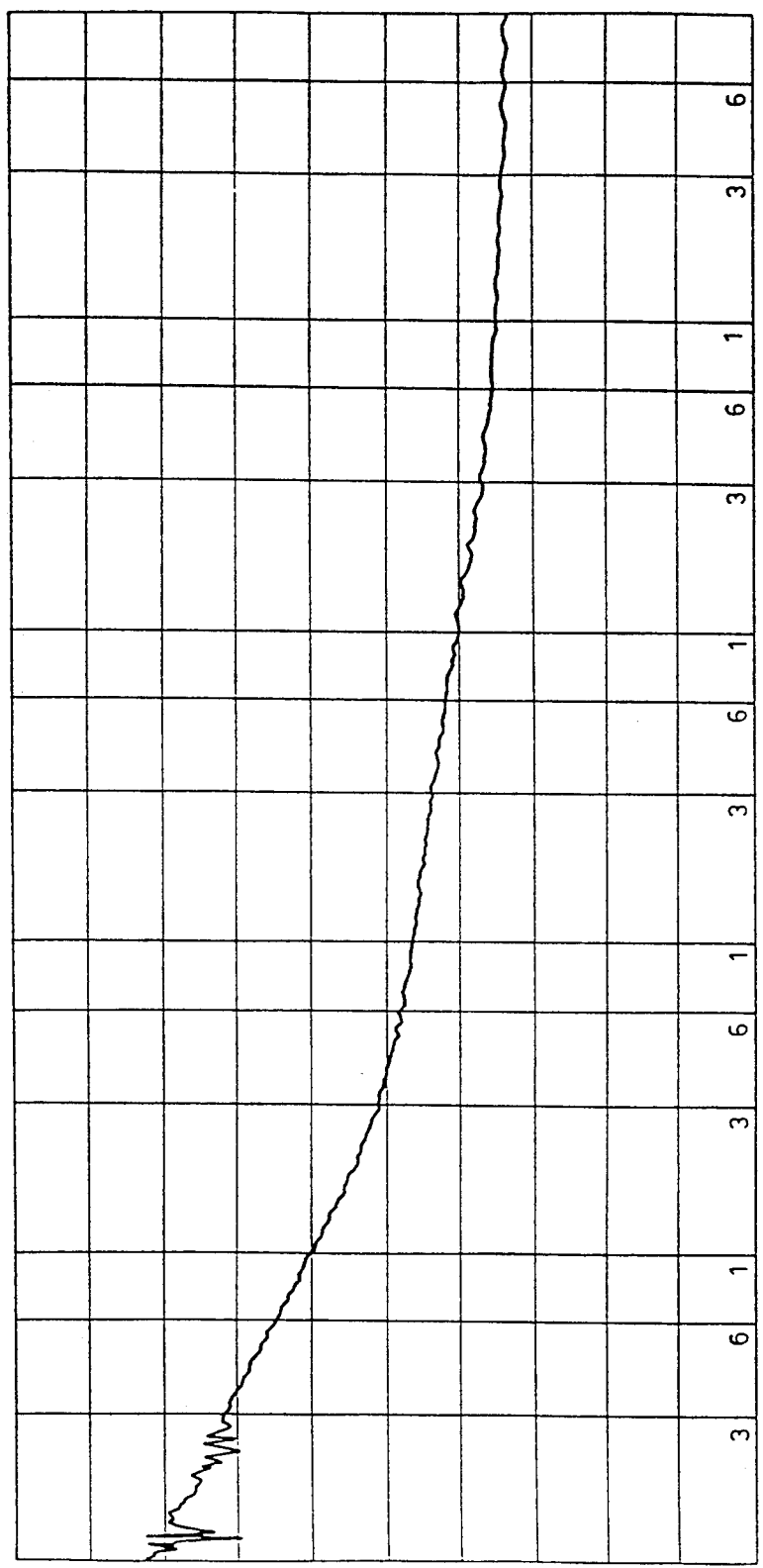
FIG. 17 is a diagram explaining the frequency dependency of the voltage gain of the differential amplifier.

Herein, when the voltage gain of the differential amplifier 1 is investigated, it is as shown in FIG. 16. The voltage gain at DC is $G_{S0} = 1.66$ from the inclination of the straight line. FIG. 17 shows the frequency dependency of the voltage gain between 10 Hz to 1 MHz and, as becomes apparent from the figure, the voltage gain is gradually lowered up several hundred KHz and becomes approximately constant above 100 KHz. Furthermore, the gain at 1 MHz is $G_{S1} = 0.74$ and it is below 50% of the DC gain.

Figure 15:
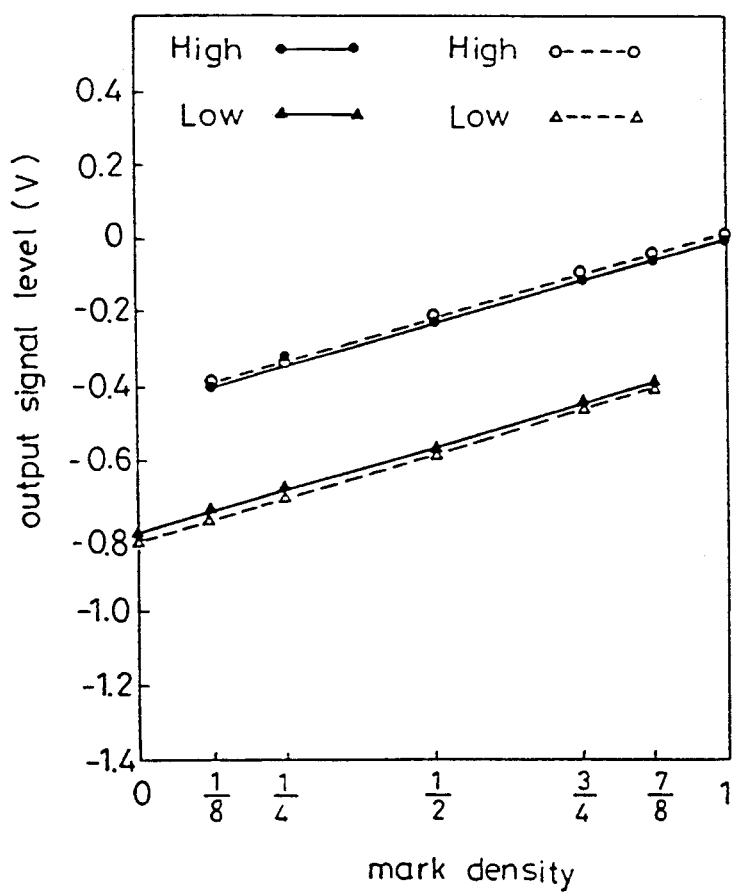
FIG. 15 is a diagram explaining the mark density dependency of the output level.

When the gain $G_{S0}$ at DC and the gain $G_{S1}$ at high frequency (above 1 MHz) are replaced in formula (6), the relation between the mark density and the output signal level is as shown in FIG. 15. It is found that it coincides with the measured value.

Here, in formula (16), the total voltage gain of the DC level adjusting syste comprising the mark density detecting circuit 2, the variable gain amplifier 4, and the DC level shifter 3 is $$G_{S0} - G_{S1} = 1.66 - 0.74 = 0.92$$

Figures 18A, 18B:
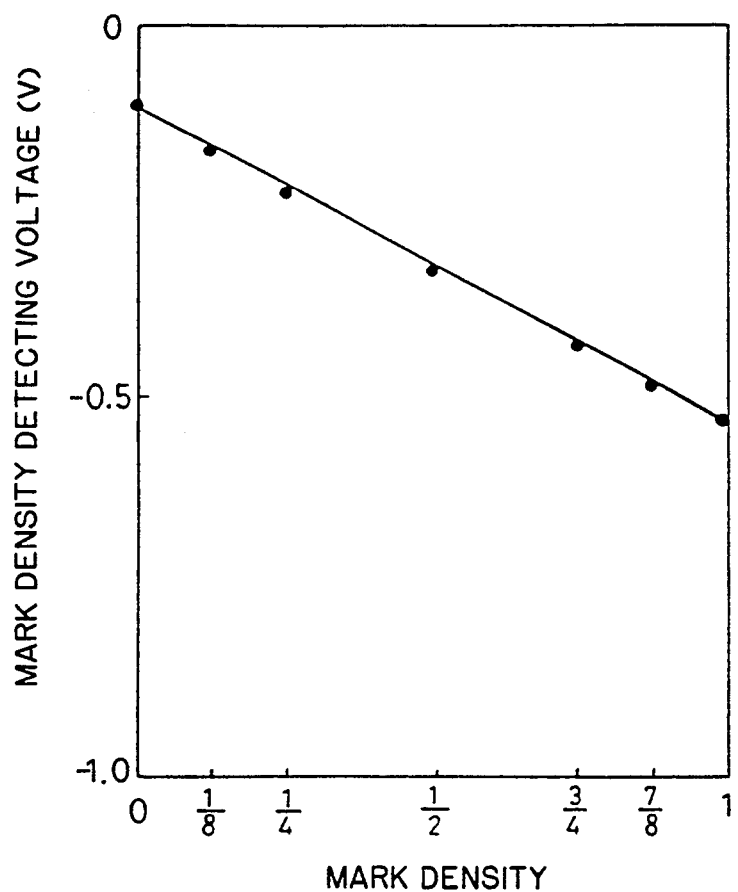
FIGS. 18(a) and 18(b) are diagrams showing the detecting characteristics of the mark density detecting circuit.

Furthermore, the gain $G_{M0}$ of the mark density detecting circuit 2 follows the inclination of the straight line of FIG. 18(a).

$$G_{M0} = \frac{-0.527 - (-0.103)}{1.0/2} = -0.85$$

Figure 19:
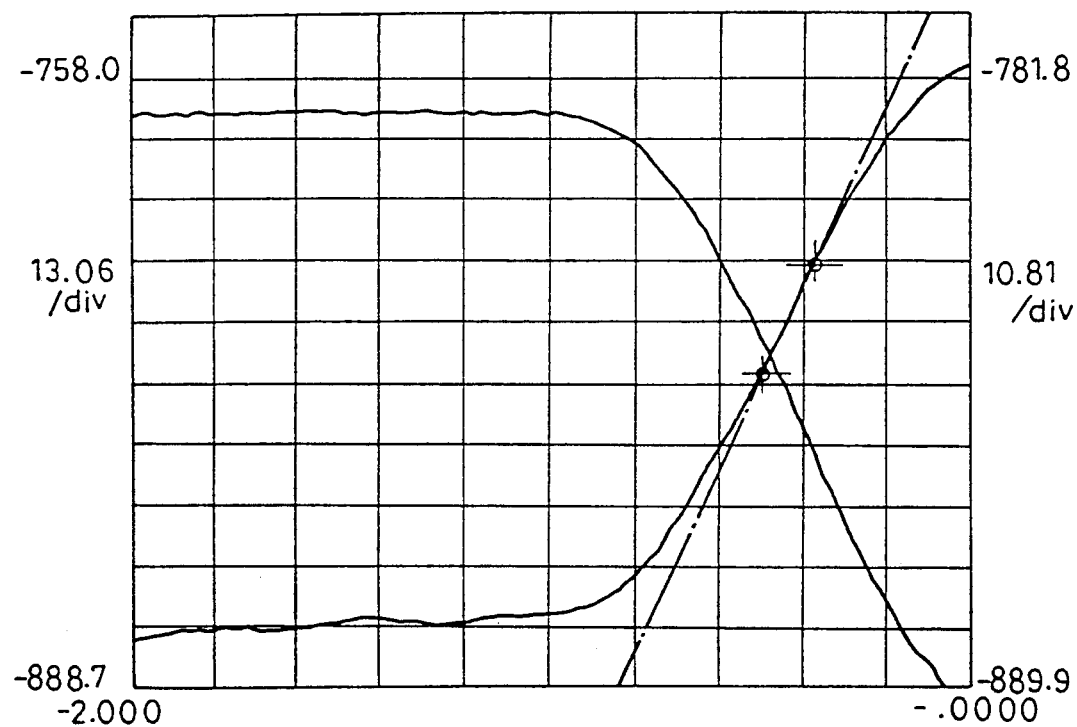
FIG. 19 is a diagram showing the I/O characteristics of the DC level shifter.

Further, the gain of the DC level shifter 3 becomes $G_{L2} = 0.193$ from the inclination of the straight line of the I/O characteristics shown in FIG. 19. Therefore, the formula (16) becomes $$\begin{aligned} G_{var} &= (1.66 - 0.74)/(G_{M0} \cdot G_{L2}) \qquad (16) \\ &= 0.92/[(-0.85) \times 0.193] \approx -5.6 \end{aligned}$$

Therefore the variable gain amplifier 4 can be set to a gain of about 5.6.

FIGS. 20 and 21 show transmission characteristics of a 5 Mb/s NRZ code in a case where the adjusting operation is turned off and on, respectively, in a circuit in which variable gain amplifier 4 is added in the circuit of FIG. 7. FIG. 20 shows the case where the adjustment operation is not performed and the output level depends on the mark density. FIG. 21 shows the case where the adjustment operation is performed and the output level is constant independent on the mark density.

Figure 22:
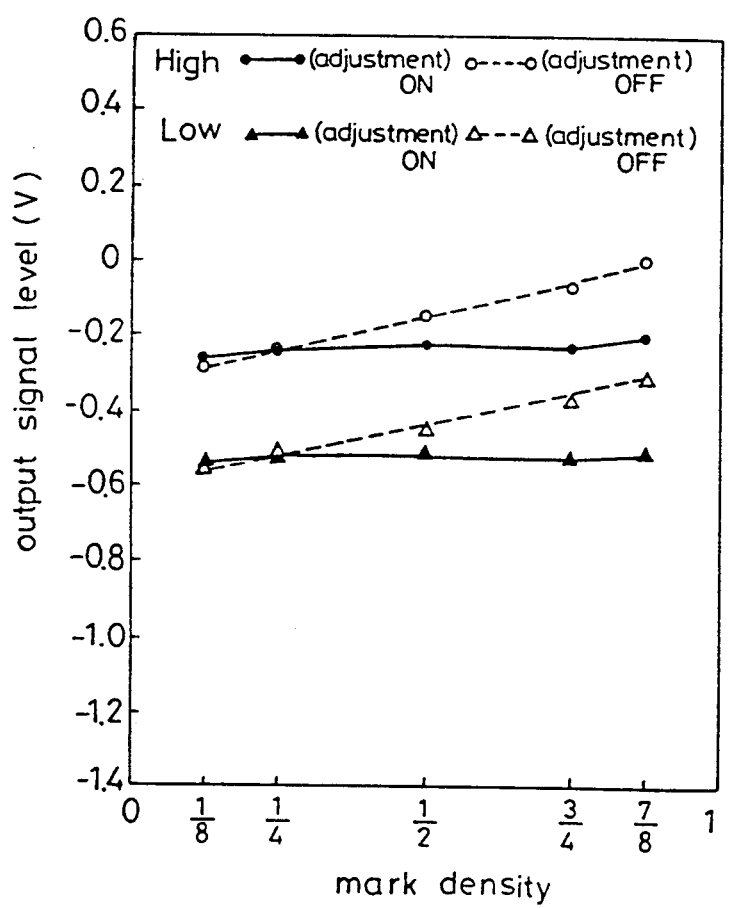
FIG. 22 is a diagram showing the relation between the output levels for the respective mark densities of the respective cases of FIGS. 20 and 21.

FIG. 22 shows the relation between the output levels where an adjustment and no adjustment are performed as in FIGS. 20 and 21 for respective mark densities.

Figure 23:
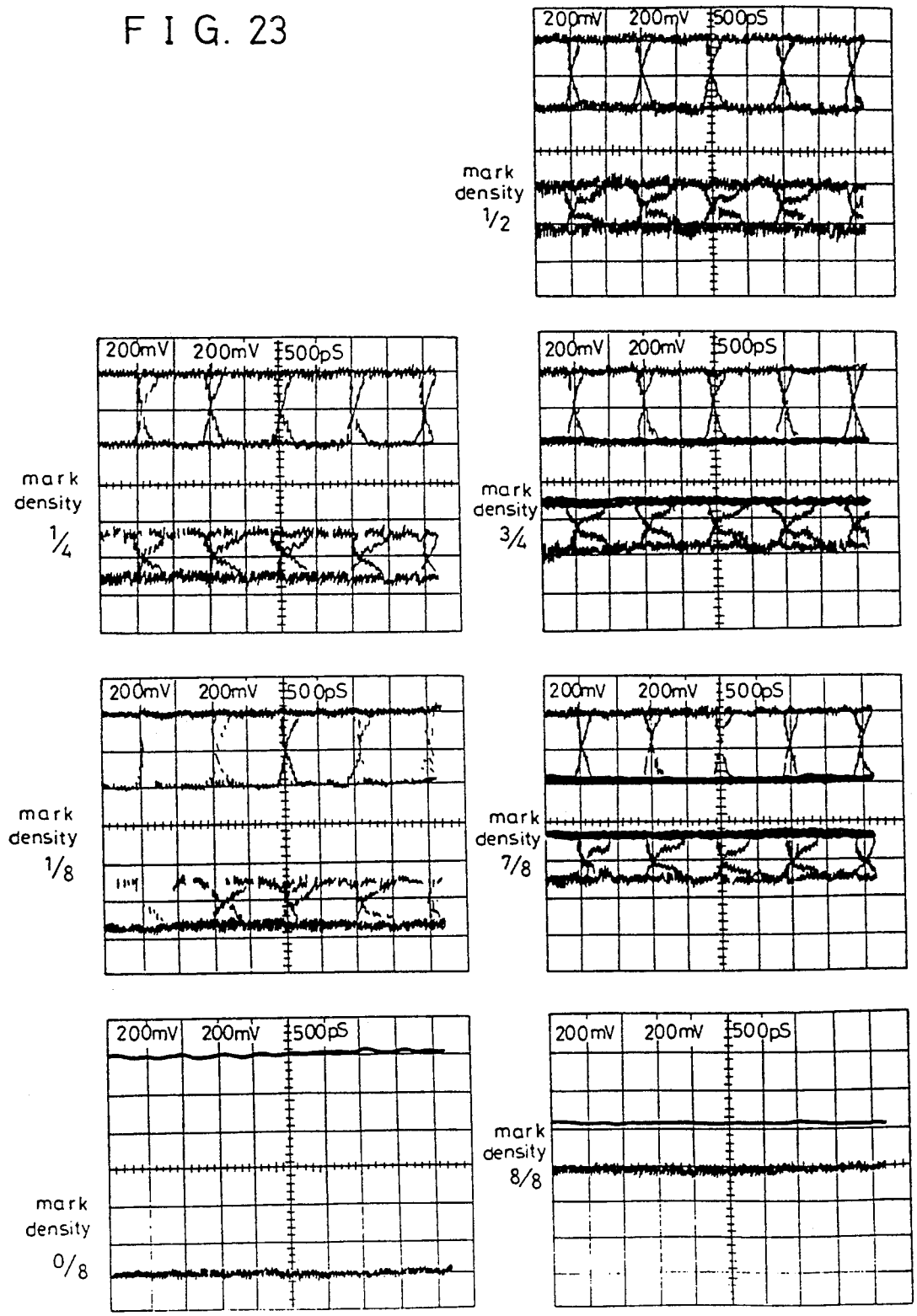
FIGS. 23 and 24 are oscilloscope traces showing the transmission characteristics of the differential amplifier when the output level of IGb/s is not corrected and is corrected, respectively.
Figure 24:
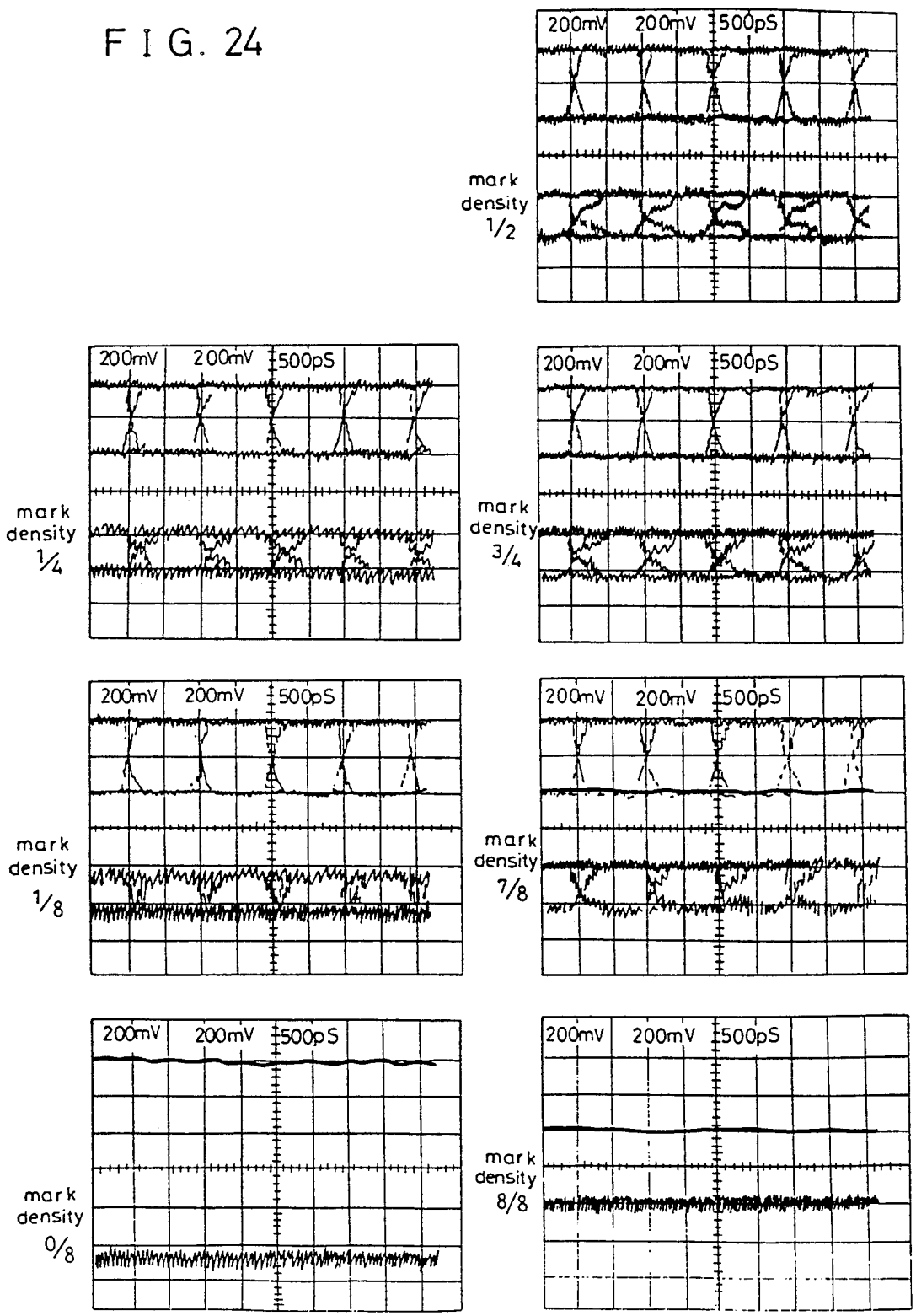

FIGS. 23 and 24 show the transmission characteristics of a NRZ code having a transmission speed of IGb/s. In FIG. 23 where no adjustment operation is performed the output level depends on the mark density while in FIG. 24 where the adjustment operation is performed, the output level is constant and independent of the mark density.

Figure 25:
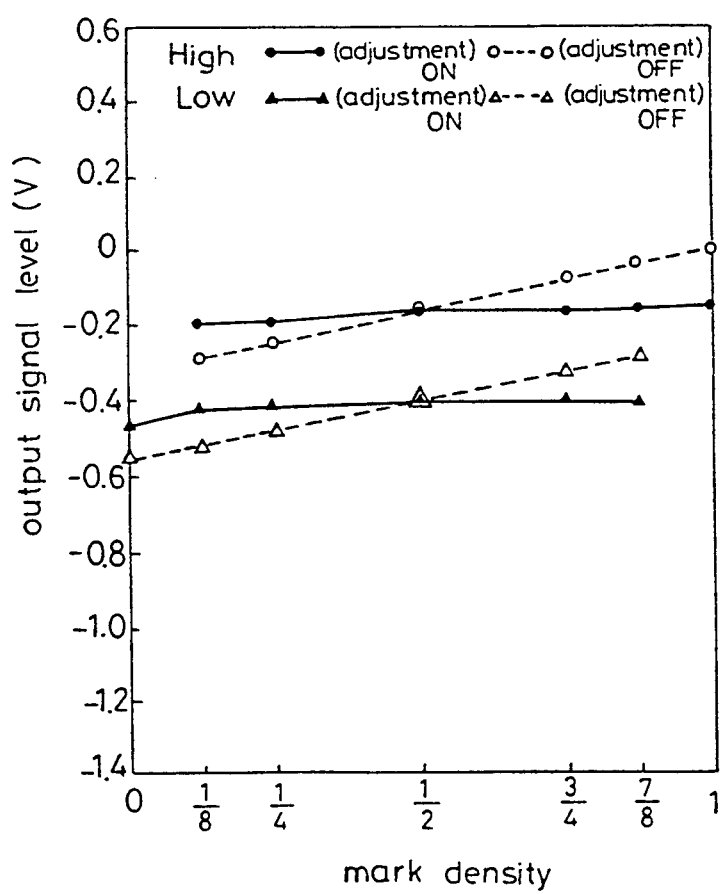
FIG. 25 is a diagram showing the relation between the output levels for the respective mark densities of the respective cases of FIGS. 23 and 24.

FIG. 25 shows the relation between the output level where an adjustment or no adjustment is performed as in FIGS. 23 and 24, respectively, in respective mark densities.

Figure 11:
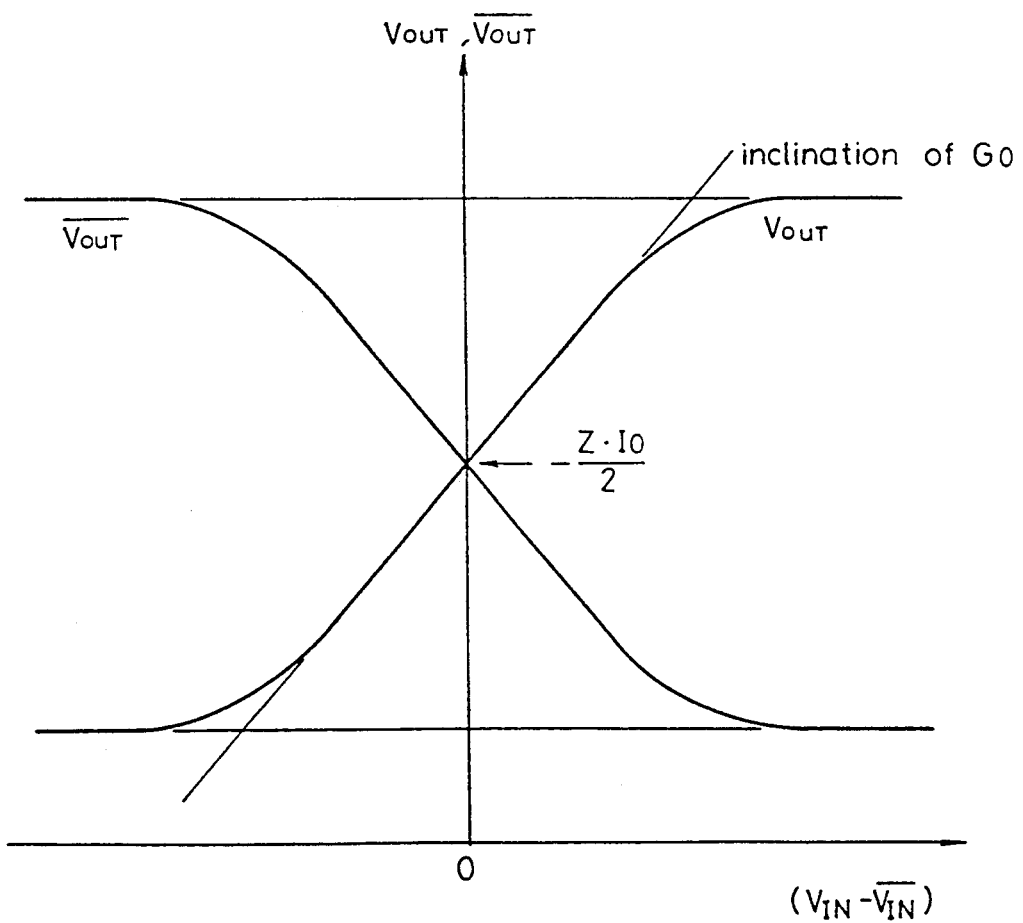
FIG. 11 is a diagram showing DC characteristics of the conventional digital transmission circuit.
Figure 12A:
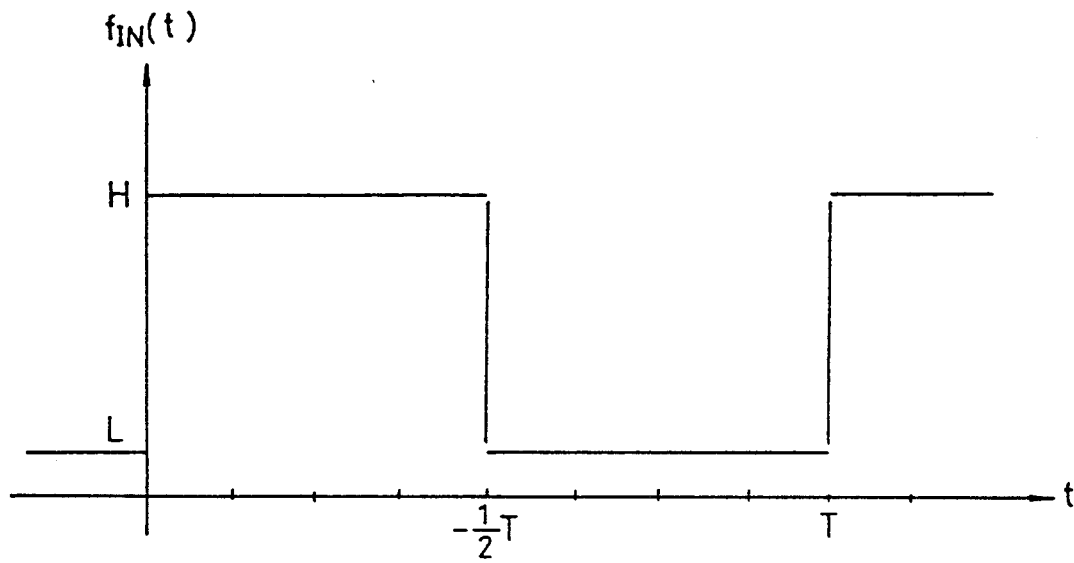
FIGS. 12(a) and 12(b) are diagrams showing input pulse signals of the digital transmission circuit.
Figure 12B:
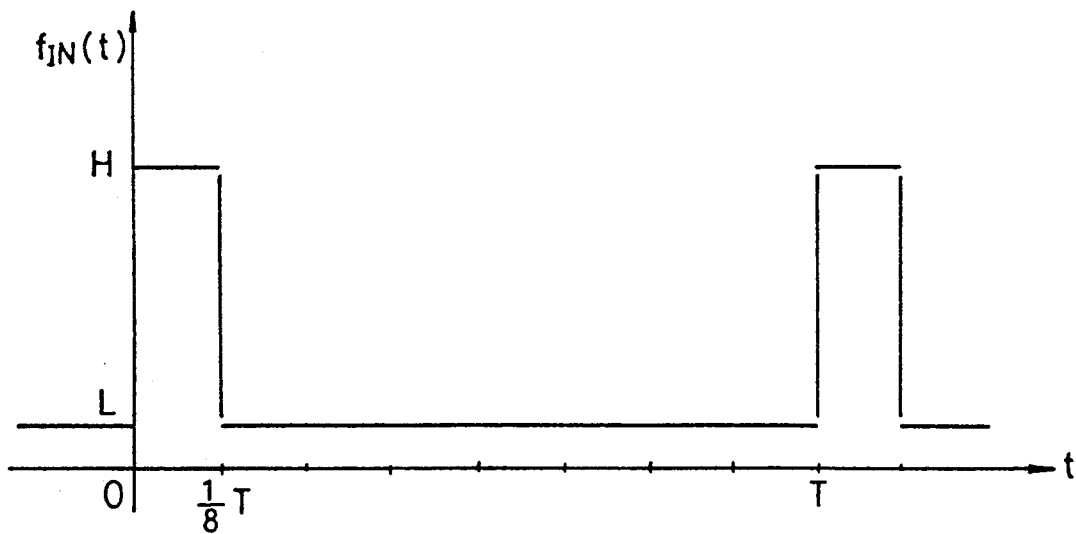
Figure 13:
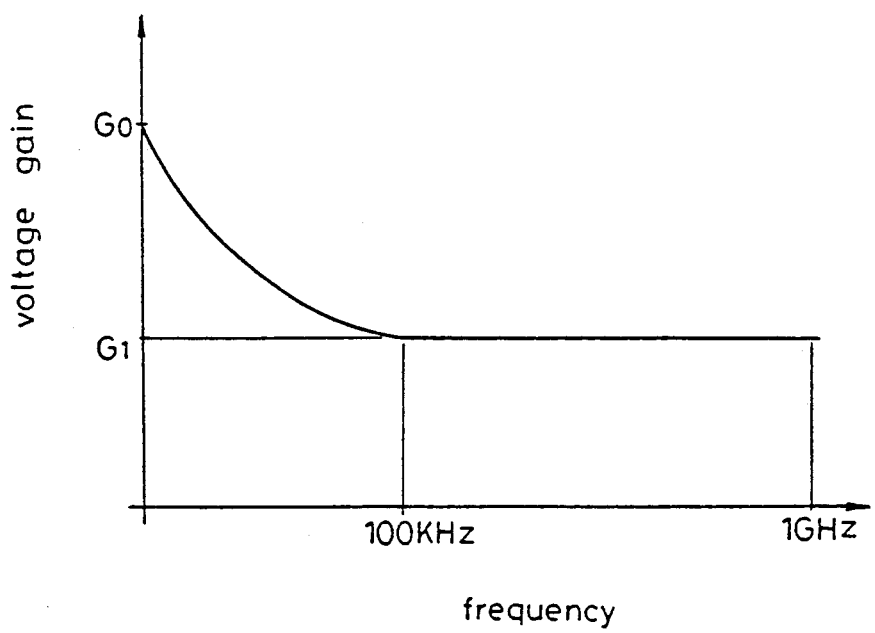
FIG. 13 is a diagram showing the frequency dependency of the voltage gain of the conventional digital transmission circuit.
Figure 14A:
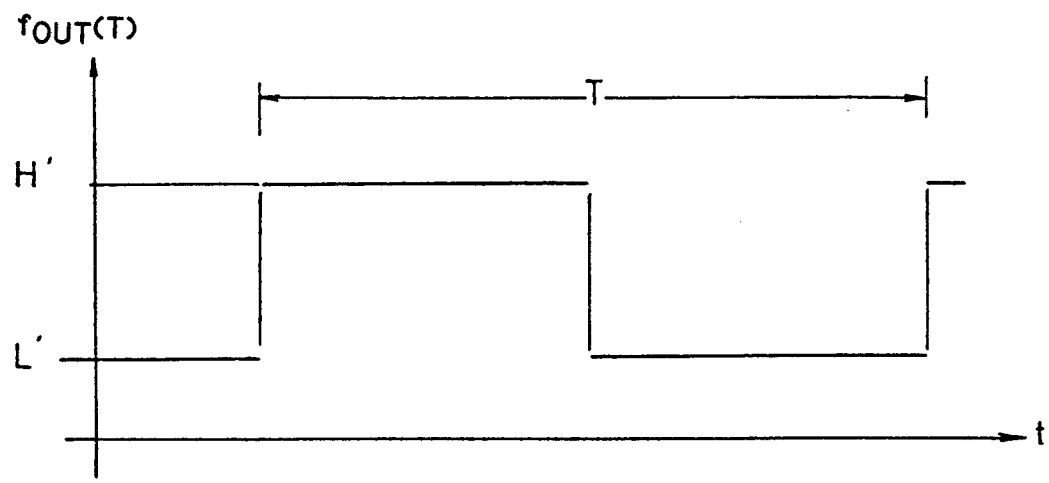
FIGS. 14(a) and 14(b) are diagrams showing output signals for the respective input signal shown in FIG. 12(a) and 12(b)
Figure 14B:
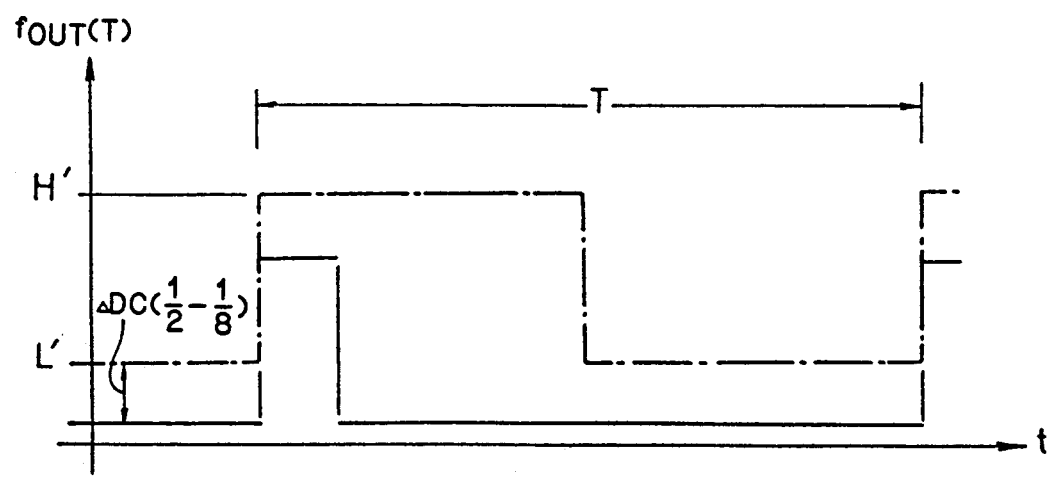

While in the above illustrated embodiment a differential amplifier 1 is used in the digital transmission circuit, if the circuit gain has such a frequency dependency that is gradually lowered from the DC level as shown in FIG. 11, another type of the amplifier such as source grounded amplifier can be used. Furthermore, a switching circuit or an impedance conversion circuit besides than the amplifier can be used.

As is evident from the foregoing description, according to the present invention, a mark density detecting circuit for detecting the DC component of a digital signal, and a DC level shifter which multiplies the DC signal component of the digital signal, inserted between the input and the output of digital transmission circuit are provided and the output of the DC level shifter is controlled by the output of the mark density detecting circuit. Therefore, drift of the output signal level in response to variations in the mark density of the input signal is prevented

What is claimed is:

1. A digital transmission circuit comprising:
   input terminals;
   output terminals; and
   signal processing means connected between said input and output terminals for processing a digital signal applied to said input terminals, the digital signal having a mark density and a DC component having a magnitude, the magnitude of the DC component being proportional to the mark density, said signal processing means producing at said output terminals an output signal having a DC signal component, said signal processing means including:
   a mark density detecting circuit connected to said input terminals for receiving the digital signal and detecting the magnitude of the DC component of the digital signal applied to said input terminals; and
   a DC level shifter connected to said output terminals and connected and responsive to said mark density detecting circuit for adjusting the magnitude of the DC signal component of the output signal produced at said output terminals in response to the magnitude of the DC component of the digital signal detected by said mark density detecting circuit whereby the output signal has an amplitude substantially independent of the mark density of the digital signal.

2. The digital transmission circuit as defined in claim 1 including a power supply wherein said DC level shifter comprises first and second FETS, each of said first and second FETs having a source terminal, a gate terminal, and a drain terminal, each of said first and second FETs being connected as a source coupled switch, and a constant current supply FET functioning as a constant current load and connected between said source terminals of said first and second FETs and said power supply, said drain terminals of said first and second FETs being connected to respective output terminals, said gate terminal of said first FET receiving a control signal from said mark density detecting circuit proportional to the DC component of said digital signal, and said gate terminal of said second FET being connected to a reference terminal for receiving a reference signal.

3. The digital transmission circuit as defined in claim 1 including a differential amplifier connected to said input terminals and between said mark density detecting circuit and said DC level shifter.

4. The digital transmission circuit as defined in claim 1 including a differential amplifier connected to said output terminals.

5. The digital transmission circuit as defined in claim 1 including a differential amplifier connected to said input terminals at the interconnection of said DC level shifter to said mark density detecting circuit.

6. A digital transmission circuit comprising:
   input terminals;
   output terminals; and
   signal processing means connected between said input and output terminals for processing a digital signal applied to said input terminals, the digital signal having a mark density and a DC component having a magnitude, the magnitude of the DC component being proportional to the mark density, said signal processing means producing at said output terminals an output signal having a DC signal component, said signal processing means including:
   a DC level shifter, connected to said input terminals for receiving the digital signal and to said output terminals for producing the output signal, for adjusting the magnitude of the DC component of the output signal produced at said output terminals; and
   a mark density detecting circuit connected to said output terminals and to said DC level shifter for detecting the magnitude of the DC component of the output signal and controlling said DC level shifter to adjust the magnitude of the DC component of the output signal whereby the output signal has an amplitude substantially independent of the mark density of the digital signal.

7. The digital transmission circuit as defined in claim 6 including a power supply wherein said DC level shifter comprises first and second FETs, each of said first and second FETs having a source terminal, a gate terminal, and a drain terminal, each of said first and second FETs being connected as a source coupled switch, a first constant current supply FET functioning as a constant current load and connected between said source terminals of said first and second FETs and said power supply, aid gate terminals of said first and second FETs being connected to respective input terminals, third and fourth FETs, each of said third and fourth FETs having a source terminal, a gate terminal, and a drain terminal, each of said third and fourth FETs being connected as a source coupled switch, ad a second constant current supply FET functioning as a constant current load and connected between said source terminals of said third and fourth FETs and said power supply, said drain terminals of said third and fourth FETs being respectively connected to said drain terminals of said first and second FETs, said gate terminal of said third FET receiving a control signal proportional to the DC component of the digital signal from said mark density detecting circuit, said gate terminal of said fourth FET being connected to a reference terminal for receiving a reference signal, fifth and sixth FETs, each of said fifth and sixth FETs having a source terminal, a gate terminal, and a drain terminal and connected as a source follower, said gate terminals of said fifth and sixth FETs being respectively connected to said drain terminals of said third and fourth FETs and said drain terminals of said fifth and sixth FETs being grounded, and first and second level shifter diodes, each of said first and second level shifter diodes having an anode terminal and a cathode terminal, said anode terminals of said first and second level shifter diodes being respectively connected to said source terminals of said fifth and sixth FETs, and said cathode terminals of said first and second level shifter diodes being connected to said power supply.

8. The digital transmission circuit as defined in claim 6 including a differential amplifier connected to said input terminals.

9. The digital transmission circuit as defined in claim 6 including a differential amplifier connected to said output terminals at the interconnection of said DC level shifter to said mark density detecting circuit.

10. The digital transmission circuit as defined in claim 6 including a differential amplifier connected to said output terminals and between said mark density detecting circuit and said DC level shifter.

* * * * *